United States Patent
Yanagisawa et al.

(10) Patent No.: US 7,564,107 B2
(45) Date of Patent: Jul. 21, 2009

(54) POWER SEMICONDUCTOR DEVICE INCLUDING A TERMINAL STRUCTURE

(75) Inventors: Satoshi Yanagisawa, Kawasaki (JP); Satoshi Aida, Kawasaki (JP); Shigeo Kouzuki, Kawasaki (JP); Hironori Yoshioka, Yokohama (JP); Ichiro Omura, Yokohama (JP); Wataru Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 10/936,601

(22) Filed: Sep. 9, 2004

(65) Prior Publication Data
US 2006/0017096 A1   Jan. 26, 2006

(30) Foreign Application Priority Data
Jul. 26, 2004   (JP) .............................. 2004-217640

(51) Int. Cl.
*H01L 29/76* (2006.01)
(52) U.S. Cl. .................. 257/409; 257/488; 257/620; 257/E29.007; 257/E29.017
(58) Field of Classification Search ................ 257/409, 257/487, 488, 491, 496, 618, 620, 622, 647, 257/E29.006, E29.007, E29.015, E29.017, 257/E29.023
See application file for complete search history.

(56) References Cited

U.S. PATENT DOCUMENTS

| | | | | |
|---|---|---|---|---|
| 5,665,634 | A * | 9/1997 | Beasom | 438/404 |
| 6,410,958 | B1 | 6/2002 | Usui et al. | |
| 6,476,458 | B2 * | 11/2002 | Miyajima | 257/496 |
| 6,635,944 | B2 * | 10/2003 | Stoisiek | 257/509 |
| 6,693,338 | B2 | 2/2004 | Saitoh et al. | |
| 6,740,931 | B2 * | 5/2004 | Kouzuki et al. | 257/341 |
| 2002/0070418 | A1 * | 6/2002 | Kinzer et al. | 257/496 |
| 2004/0140521 | A1 * | 7/2004 | Okumura et al. | 257/510 |
| 2004/0222490 | A1 * | 11/2004 | Raaijmakers et al. | 257/510 |
| 2005/0029568 | A1 * | 2/2005 | Tokuda et al. | 257/302 |
| 2005/0282375 | A1 * | 12/2005 | Nitta et al. | 438/620 |

FOREIGN PATENT DOCUMENTS

EP     0661753 A1 *  7/1995
JP     2001-15744     1/2001

OTHER PUBLICATIONS

Derwent Publication KR 2004059365A Yoon, I Y, Jul. 2004.*
U.S. Appl. No. 12/138,875, filed Jun. 13, 2008, Saito et al.

* cited by examiner

*Primary Examiner*—Matthew E Warren
(74) *Attorney, Agent, or Firm*—Oblon, Spivak, McClelland, Maier & Neustadt, P.C.

(57) ABSTRACT

A semiconductor device is disclosed, which comprises a terminal section formed to surround a device active region. The terminal section includes a trench formed in the semiconductor layer, and a filler filled in the trench. A field plate is extended to above the trench from an electrode of the semiconductor element formed in the device active region.

17 Claims, 17 Drawing Sheets

US 7,564,107 B2

POWER SEMICONDUCTOR DEVICE INCLUDING A TERMINAL STRUCTURE

CROSS-REFERENCE TO PRIOR APPLICATION

This application is based upon and claims the benefit of priority from the prior Japanese Patent Application No. 2004-217640, filed on Jul. 26, 2004, the entire content of which is incorporated herein by reference.

BACKGROUND OF THE INVENTION

1. Field of the Invention

The present invention relates to a semiconductor device and more particularly to a power semiconductor device employed in circuits for large power, which comprises a terminal structure to surround a device active region.

2. Description of the Related Art

A power semiconductor chip comprises a device active region that contains a source and a gate electrode of a transistor formed therein, and a terminal section that surrounds the device active region. The terminal section is formed to relieve an electric field at an end of the semiconductor device active region. A most typical configuration of the terminal section includes planar termination using guard rings as shown in FIG. 25. In this case, an electric field placed at the terminal section for the device active region can be extended toward the outside of the semiconductor chip.

When a higher rated voltage is employed, however, it is required to space the guard rings in layers at a certain interval. In a recent typical IGBT or MOSFET with a rated voltage of 600 V, it is required to space a plurality of guard rings with widths of 20-30 μm at an interval of several tens of μm. Accordingly, the terminal section has a width as large as several hundreds of μm, which increases the area of the terminal section, resulting in a problem associated with an increased area of the entire semiconductor element.

JP-A 2001-15744, also filed by the present applicant, proposes a semiconductor device having a trench formed in a depth extending from an upper layer to a floating doping layer in a terminal section of Super FET structure. This configuration is effective to prevent a breakdown voltage of the semiconductor device from lowering without increasing the area of the terminal section. In the semiconductor device disclosed in JP-A 2001-15744, however, the effect is exerted in elements having the floating doping layer and not sufficiently exerted in semiconductor elements having no floating doping layer.

SUMMARY OF THE INVENTION

The present invention provides a semiconductor device, which comprises a device active region defined for forming a semiconductor element in a semiconductor layer formed on a semiconductor substrate; and a terminal section formed in the semiconductor layer to surround the device active region. The terminal section includes a trench formed in the semiconductor layer, and a filler filled in the trench. The semiconductor device further comprises a field plate extended to above the trench from a main electrode of the semiconductor element formed in the device active region.

DETAILED DESCRIPTION OF THE INVENTION

A semiconductor chip according to an embodiment of the present invention will now be described with reference to the drawings.

Figure 1:
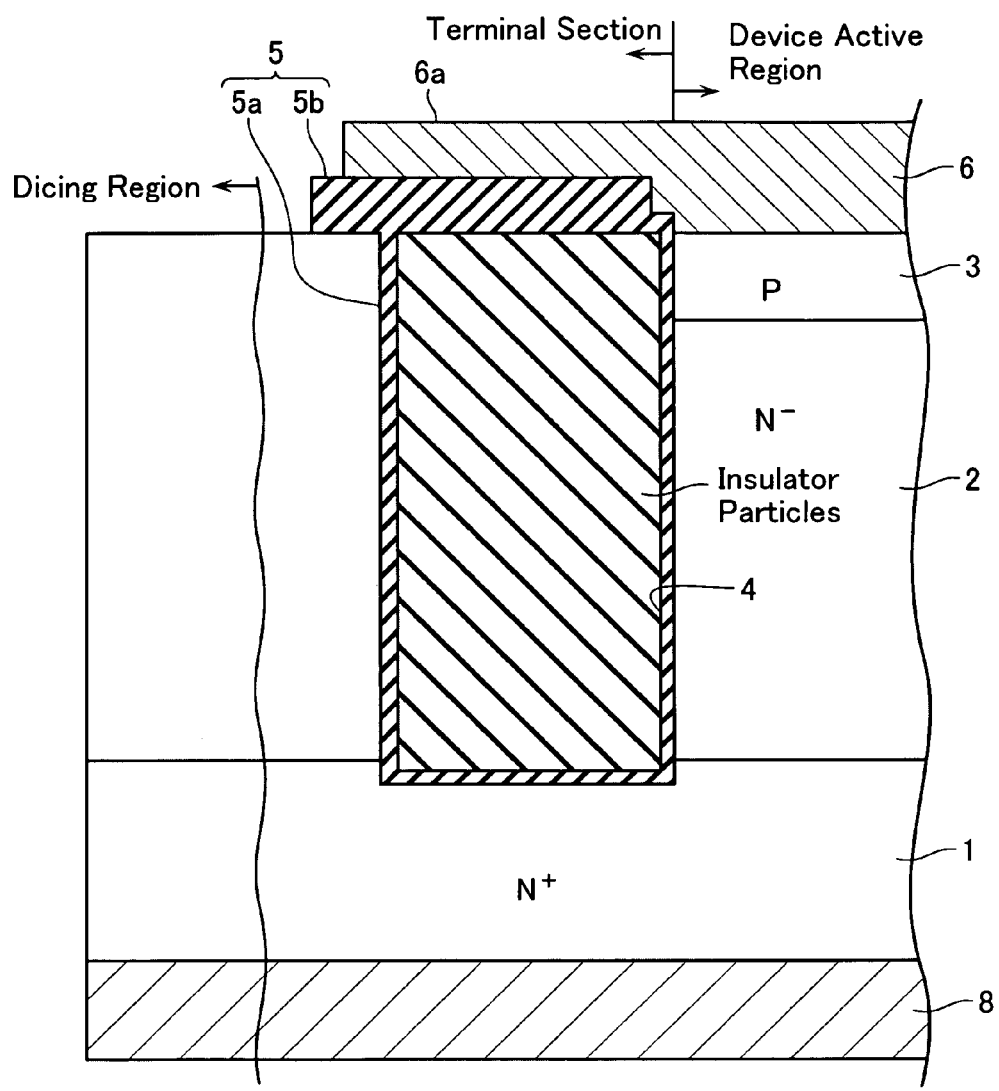
FIG. 1 is a cross-sectional view of a terminal section and a device active region proximate thereto in a semiconductor chip of a first embodiment of the present invention.
Figure 2:
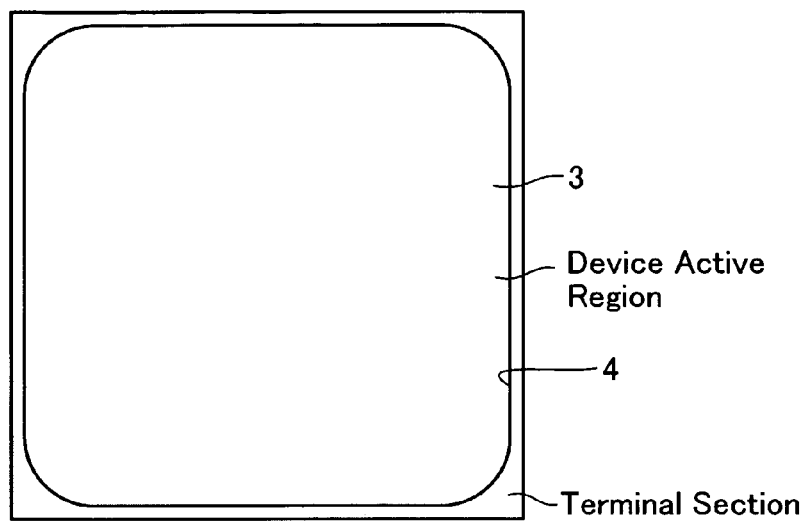
FIG. 2 is a plan view of the semiconductor chip of the first embodiment of the present invention with the exception of metal portions such as an electrode metal film.

FIG. 1 is a cross-sectional view of a terminal section and a device active region proximate thereto in a semiconductor chip of the first embodiment. FIG. 2 is a plan view of the semiconductor chip of the first embodiment with the exception of metal portions such as an electrode metal film.

The semiconductor chip is formed to have a device active region for forming a semiconductor element such as a MOSFET or an IGBT therein, and a terminal section for surrounding the device active region. The semiconductor element formed in the device active region is not limited particularly. FIG. 1 shows an example that includes an $N^+$-type layer 1 as a semiconductor substrate, an $N^-$-type epitaxial layer 2 formed as a semiconductor layer on the layer 1, and a P-type base layer 3 formed as a part of a planar MOSFET in the layer 2.

In the terminal section, a trench 4 is formed with a width of about 20-30 μm through the $N^-$-type epitaxial layer 2 into a depth reaching the $N^+$-type layer 1. The trench 4 is formed at a boundary between the device active region and the terminal section to surround the device active region as shown in FIG. 2. A silicon oxide film 5a is formed on the inner wall of the trench 4. The trench 4 is filled with insulator particles such as silica particles on the silicon oxide film 5a. The silica particles comprise particles of silicon oxide with a diameter of about 300 nm, which is sufficiently smaller than the width of the trench 4. They are filled in the trench 4 by applying a solution that contains the silica.

A silicon oxide film 5b is formed above the trench 4 filled with the silica particles to form a silicon oxide film 5 together with the silicon oxide film 5a.

A field plate 6a is formed on the silicon oxide film 5b as an extension of an electrode metal film 6 of the semiconductor element formed in the device active region.

A bottom electrode 8 is formed as a drain electrode beneath the $N^+$-type layer 1.

Figure 3:
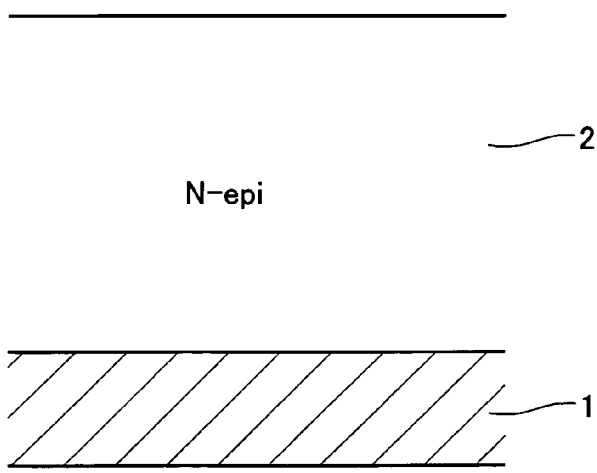
FIG. 3 shows a process step of manufacturing the semiconductor chip.
Figure 4:
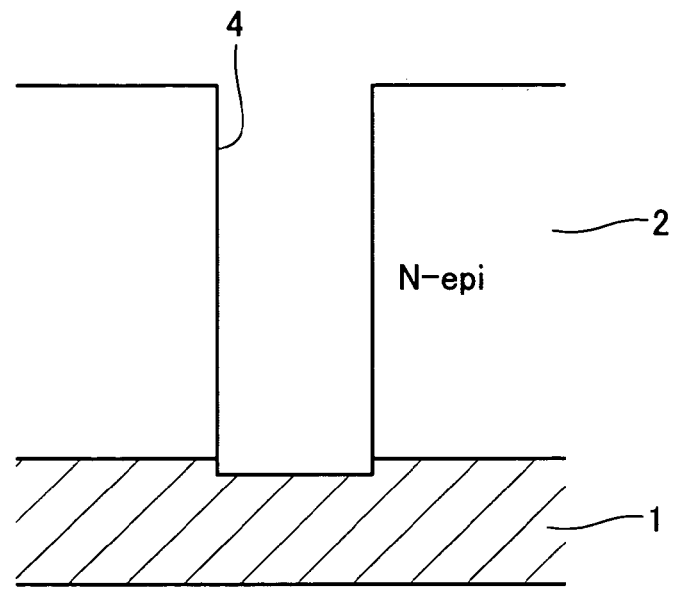
FIG. 4 shows a process step of manufacturing the semiconductor chip.
Figure 5:
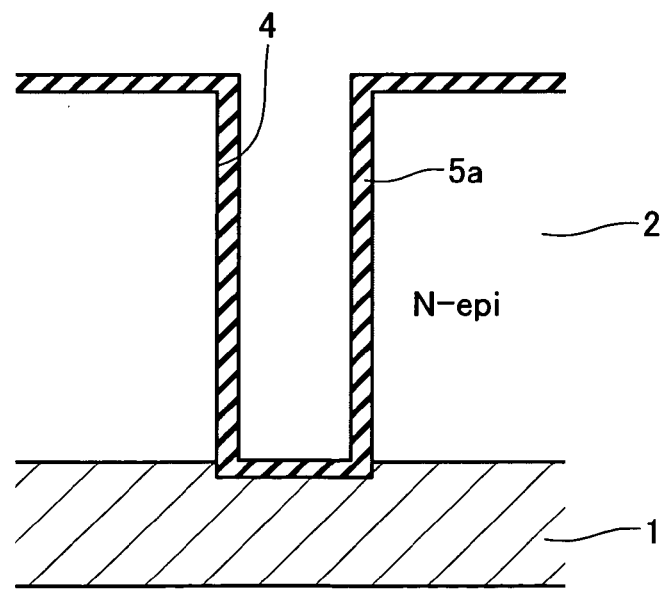
FIG. 5 shows a process step of manufacturing the semiconductor chip.
Figure 6:
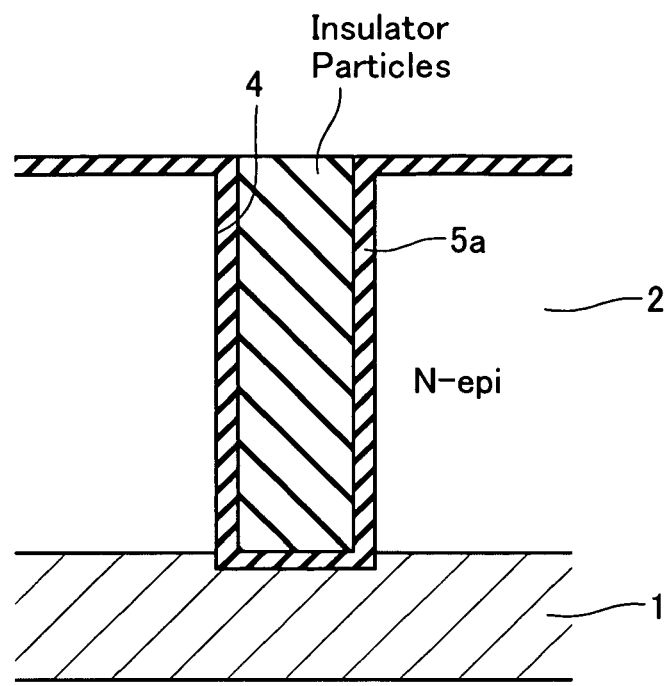
FIG. 6 shows a process step of manufacturing the semiconductor chip.
Figure 7:
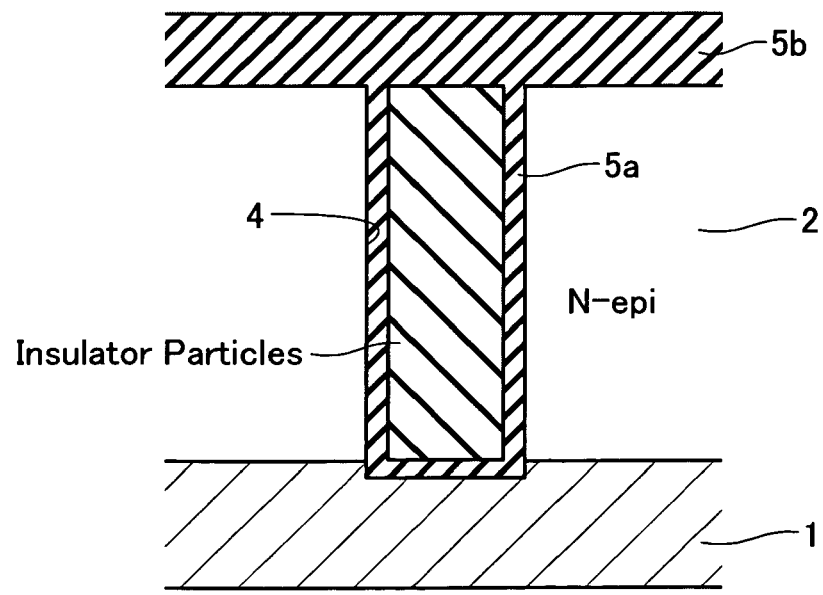
FIG. 7 shows a process step of manufacturing the semiconductor chip.
Figure 8:
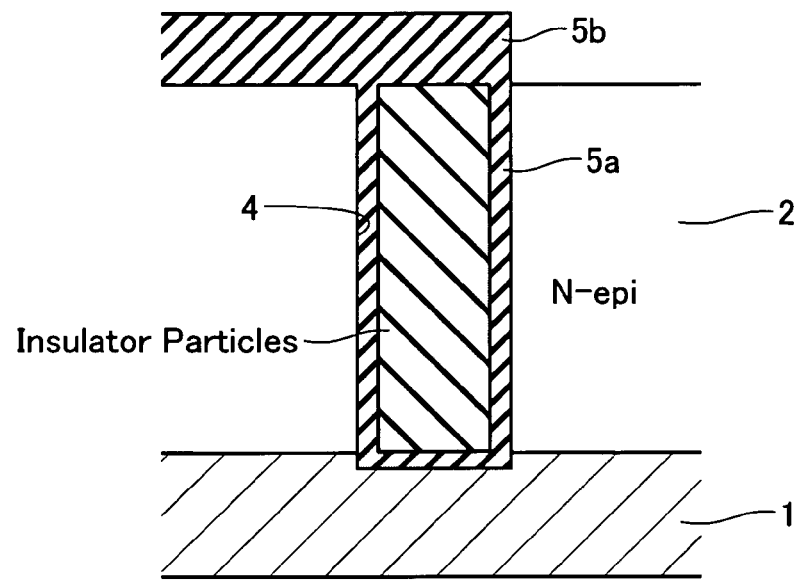
FIG. 8 shows a process step of manufacturing the semiconductor chip.
Figure 9:
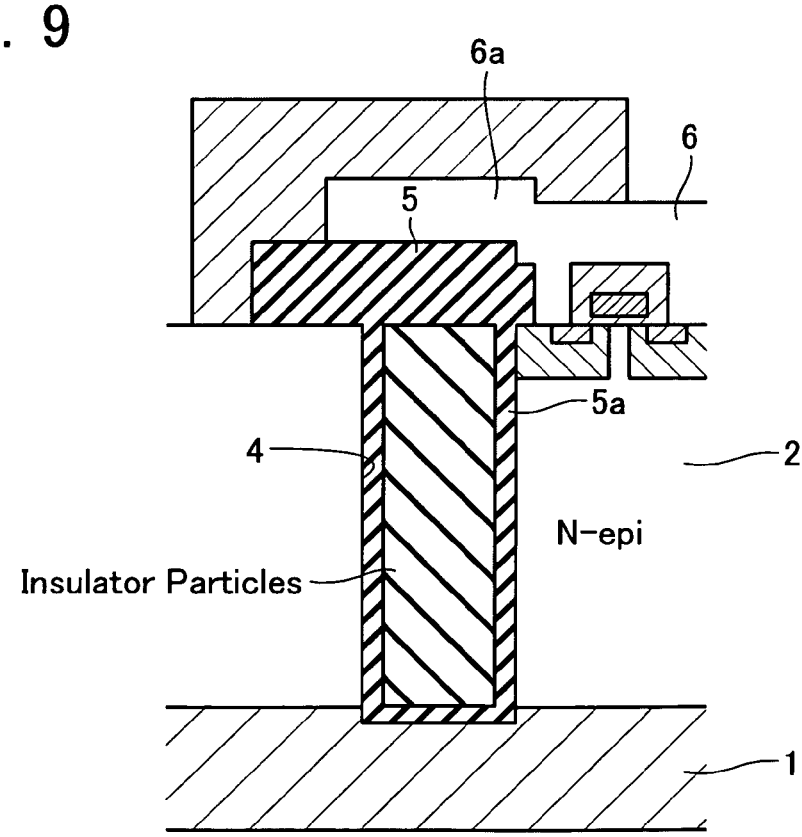
FIG. 9 shows a process step of manufacturing the semiconductor chip.

Process steps of manufacturing the semiconductor chip are described next with reference to FIGS. 3-9. First, the $N^-$-type epitaxial layer 2 is formed through epitaxial growth on the $N^+$-type layer 1 (FIG. 3). Then, photolithography and RIE (Reactive Ion Etching) processes are applied to form the trench 4 in the $N^-$-type epitaxial layer 2 (FIG. 4). Subsequently, the silicon oxide film 5a is formed at least on the inner wall of the trench 4 through, for example, thermal oxidation (FIG. 5). The trench 4 is then filled with silica particles (FIG. 6), and the silicon oxide film 5b is deposited over the entire surface through a process of thermal oxidation or CVD (FIG. 7). Thereafter, the silicon oxide film 5b formed in the device active region is removed therefrom through photolithography and etching processes (FIG. 8). In addition, a publicly known procedure is employed to form, for example, a planar MOSFET in the device active region to complete the semiconductor chip (FIG. 9). An electrode metal is deposited over the entire surface and undesired portions are removed therefrom through processes of photolithography and wet etching to form the electrode metal film 6. In this case, the etching is executed so as to leave the portion required to form the field plate 6a above the silicon oxide film 5b.

Figure 10:
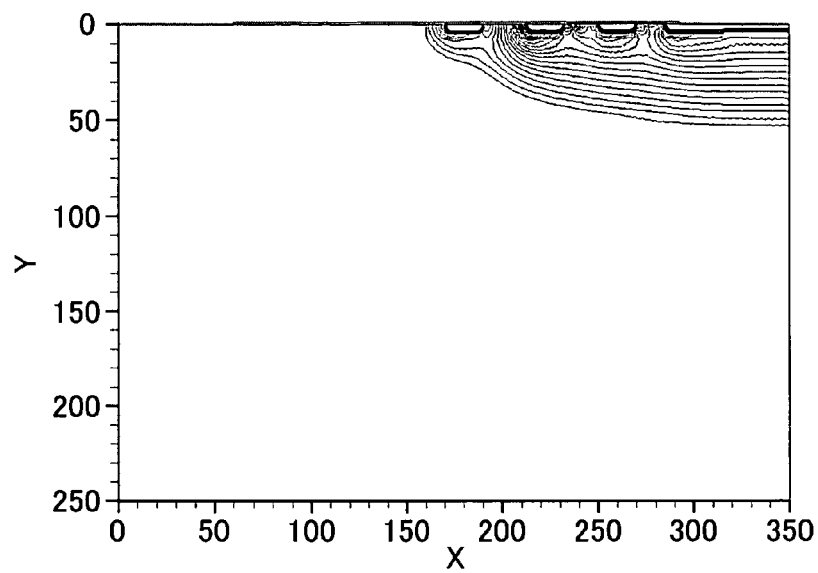
FIG. 10 shows an electric field distribution (simulated by computer) when a reverse bias is applied in a semiconductor chip provided with a plurality of guard rings in the prior art (FIG. 25)
Figure 25:
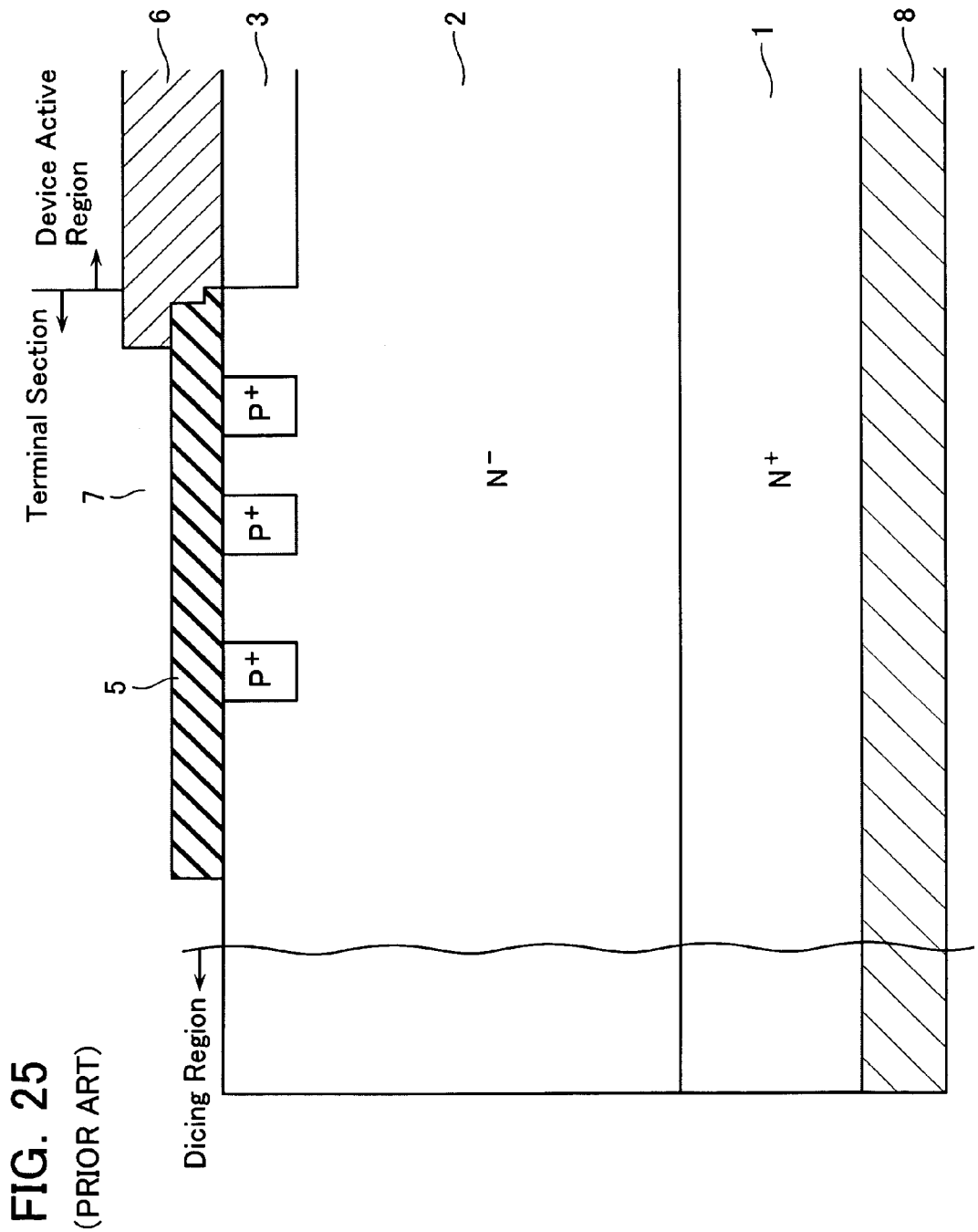
FIG. 25 shows a terminal section configured with planar termination using guard rings in the prior art.

A breakdown voltage performance of the semiconductor chip of the embodiment is described with reference to FIGS. 10-12. FIG. 10 shows an electric field distribution (simulated by computer) when a reverse bias is applied in a semiconductor chip in a 600 V series provided with a plurality of guard rings in the prior art (FIG. 25).

In this case, the electric field is found extending from the guard rings to external. A width required as the terminal section is equal to about 150 μm at least at the guard rings while a width of about 300 μm is provided for the reasons such as stabilization of the breakdown voltage.

Figure 11:
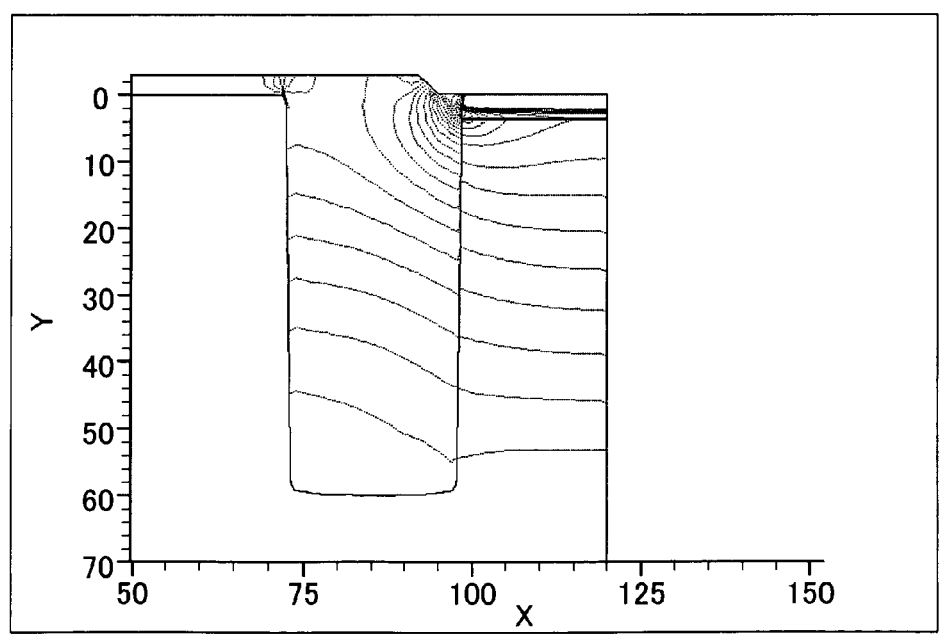
FIG. 11 shows an electric field distribution (simulated by computer) when a reverse bias is applied in a semiconductor chip having a trench 4 (without a field plate 6a thereon) formed in a terminal section and filled with an insulator such as silica particles.

FIG. 11 shows an electric field distribution (simulated by computer) when a reverse bias is applied in a semiconductor chip having a trench 4 (without a field plate 6a thereon) formed in a terminal section and filled with an insulator such as silica particles like in this embodiment. In this case, the electric field is concentrated on an end of the P-type base layer 3 (a portion adjacent to the trench 4) and a portion inside the trench 4 proximate to the P-type base layer 3. This demonstrates that reduction in breakdown voltage is not sufficiently avoided.

Figure 12:
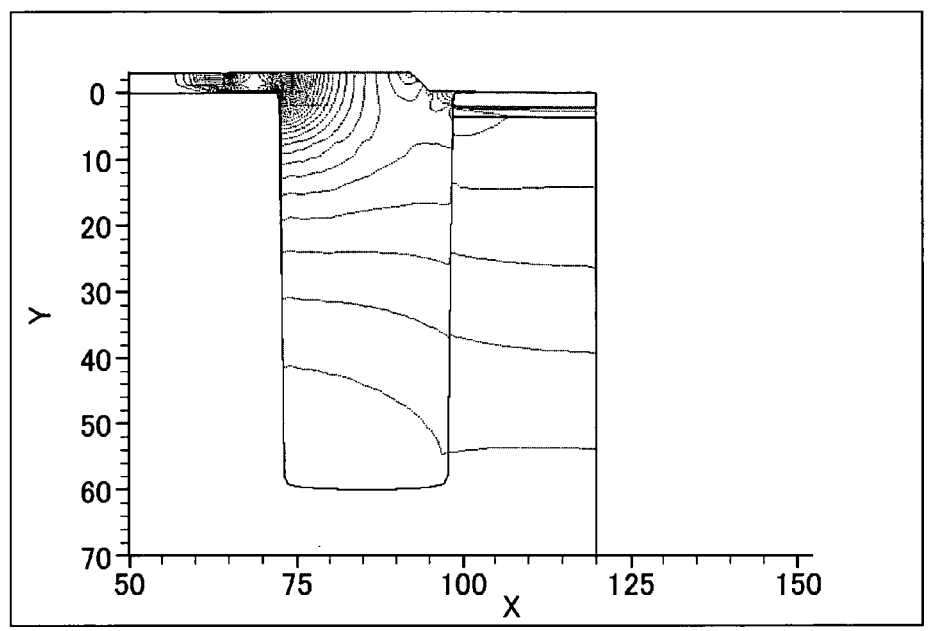
FIG. 12 shows an electric field distribution (simulated by computer) when a reverse bias is applied in a semiconductor chip having the structure of the first embodiment (FIG. 1)

FIG. 12 shows an electric field distribution (simulated by computer) when a reverse bias is applied in a semiconductor chip having the structure of the first embodiment (FIG. 1).

In this case, the electric field is found concentrated in the oxide film proximate to the tip of the extended field plate 6a and relieved in the device active region and inside the trench 4. Therefore, it can be considered in comparison with the above two examples that the breakdown voltage is kept higher at the terminal of the semiconductor element formed in the device active region. When a certain simulation condition is determined, the breakdown voltage is estimated to reach 533 V in the case of FIG. 11 and 657 V in the case of FIG. 12.

Figure 14:
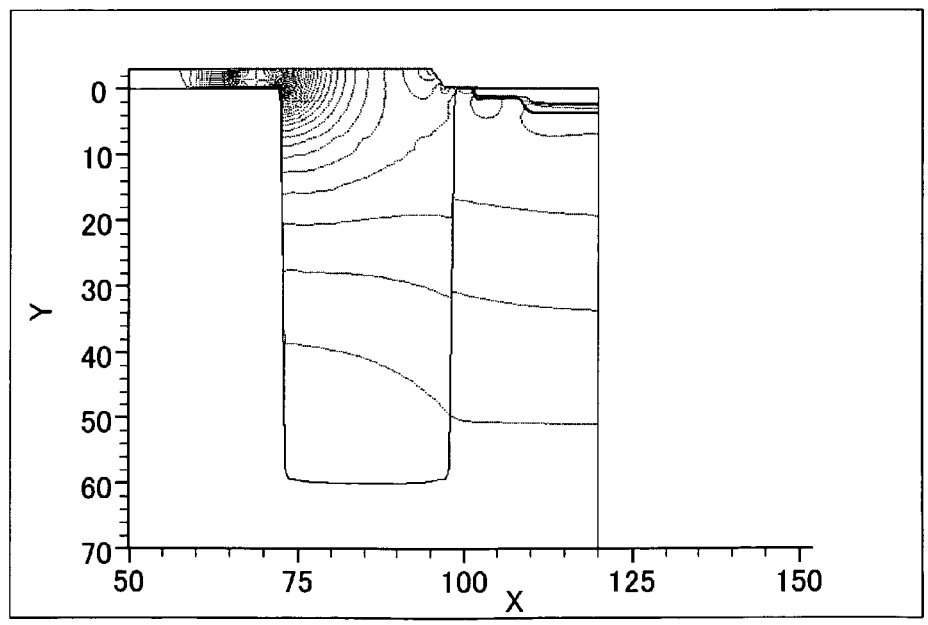
FIG. 14 shows a simulated electric field distribution when a reverse bias is applied to a transistor formed in the device active region in the structure shown in FIG. 13.
Figure 13:
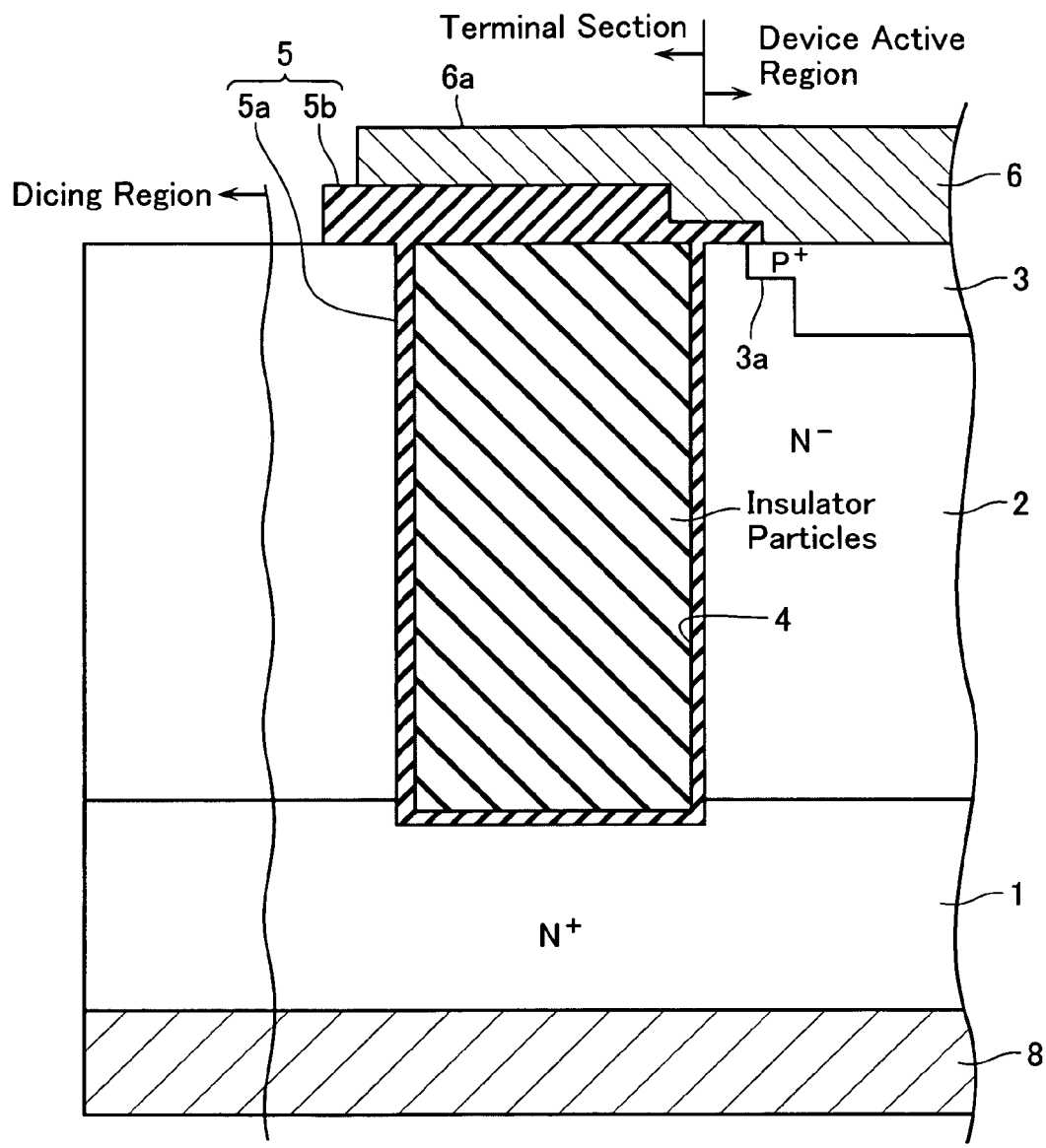
FIG. 13 shows an alternative of the first embodiment.

FIG. 13 is an alternative of the first embodiment. It shows a $P^+$-type layer 3a having a high impurity concentration, which is shallower than the P-type base layer 3 and formed close to the trench 4 at the end of the P-type base layer 3 formed in the device active region. The terminal section has a structure almost similar to that in FIG. 1. FIG. 14 shows a simulated electric field distribution when a reverse bias is applied in this structure. In this case, under the same simulation condition as in the case of FIG. 12, the breakdown voltage reaches 679 V, which is found much higher than the case of FIG. 12. If the $P^+$-type layer 3a is replaced with a $P^-$-type layer having a lower impurity concentration than the P-type base layer 3, the breakdown voltage is estimated to reach 663 V under the same simulation condition, which is found higher than that in the case of FIG. 12.

Figure 15:
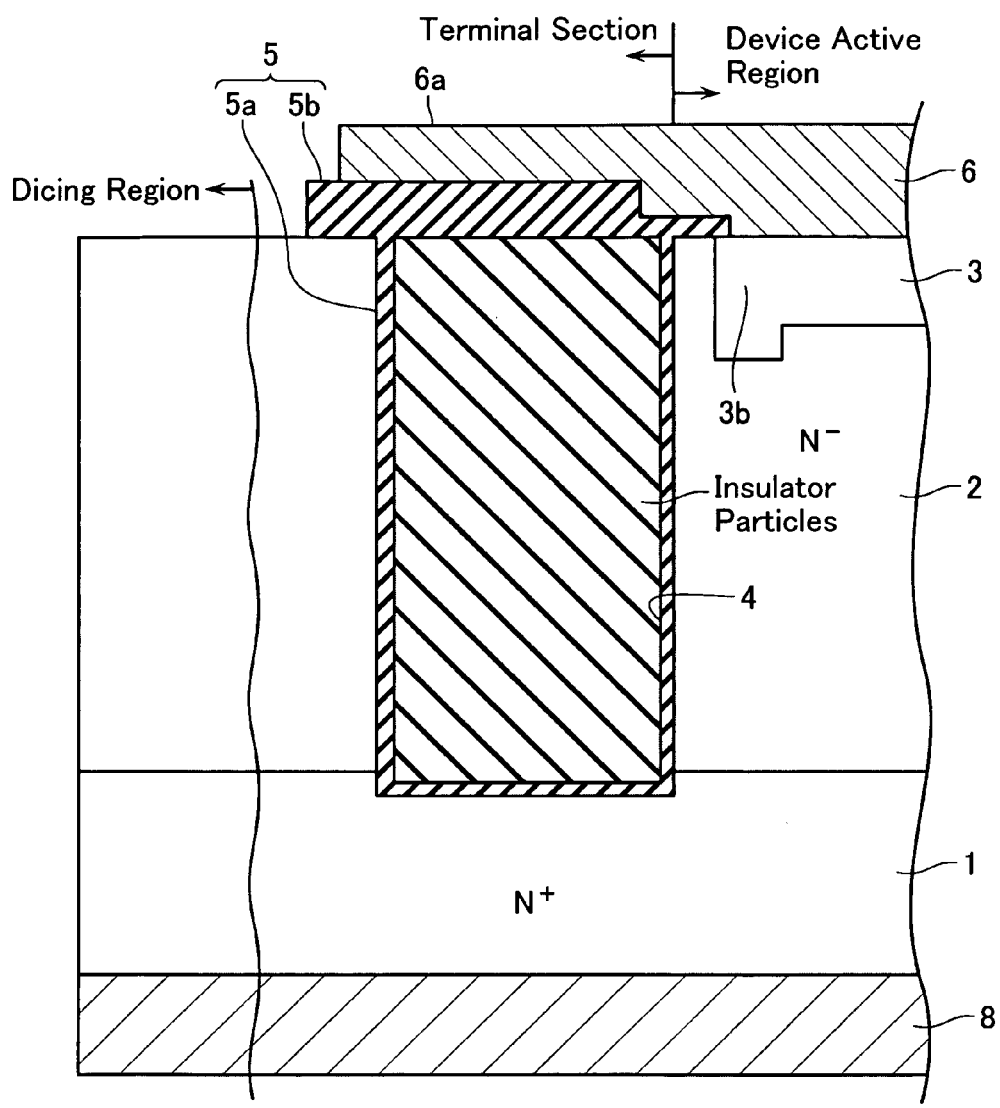
FIG. 15 shows another alternative of the first embodiment.
Figure 16:
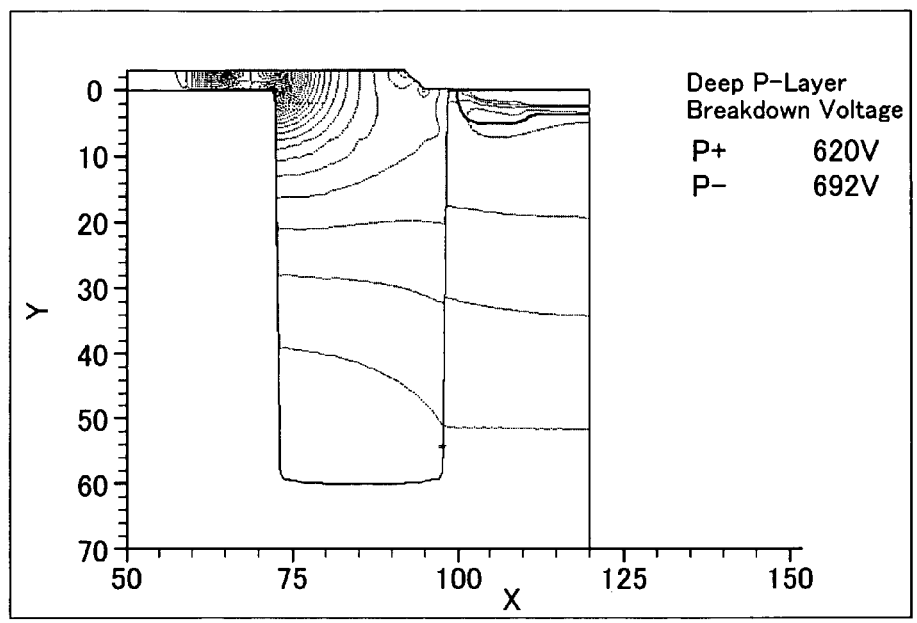
FIG. 16 shows a simulated electric field distribution when a reverse bias is applied to a transistor formed in the device active region in the structure shown in FIG. 15.

FIG. 15 is another alternative of the first embodiment. It shows a $P^+$-type layer 3b having a high impurity concentration, which is deeper than the P-type base layer 3 and formed close to the trench 4 at the end of the P-type base layer 3. The terminal section has a structure almost similar to that in FIG. 1. FIG. 16 shows a simulated electric field distribution when a reverse bias is applied in this structure. In this case, under the same simulation condition as in the case of FIG. 12, the breakdown voltage is estimated to reach 620 V, which is slightly lower than that in the case of FIG. 12 but can keep a breakdown voltage of 600 V or higher.

If the $P^+$-type layer 3b is replaced with a $P^-$-type layer having a lower impurity concentration than the P-type base layer 3, under the same simulation condition as in the case of FIG. 12, the breakdown voltage is estimated to reach 692 V, which is contrary higher than that in the case of FIG. 12.

Figure 17:
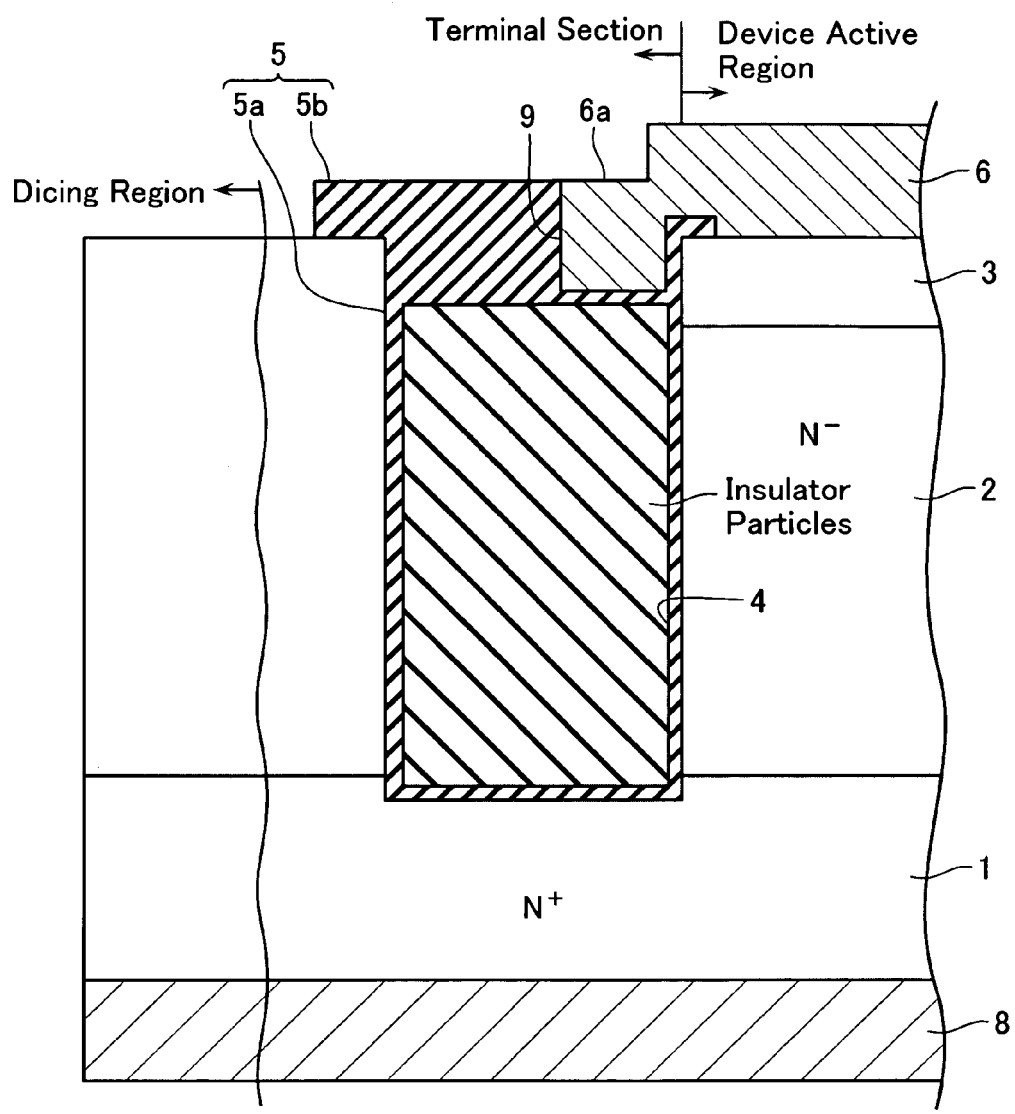
FIG. 17 shows a cross-sectional view of the major part of a semiconductor chip of a second embodiment of the present invention.

FIG. 17 shows a cross-sectional view of the major part of a semiconductor chip of a second embodiment of the present invention. In this embodiment, a notch 9 is formed above the silicon oxide film 5b. The field plate 6a is formed to enter the notch 9.

Figure 18:
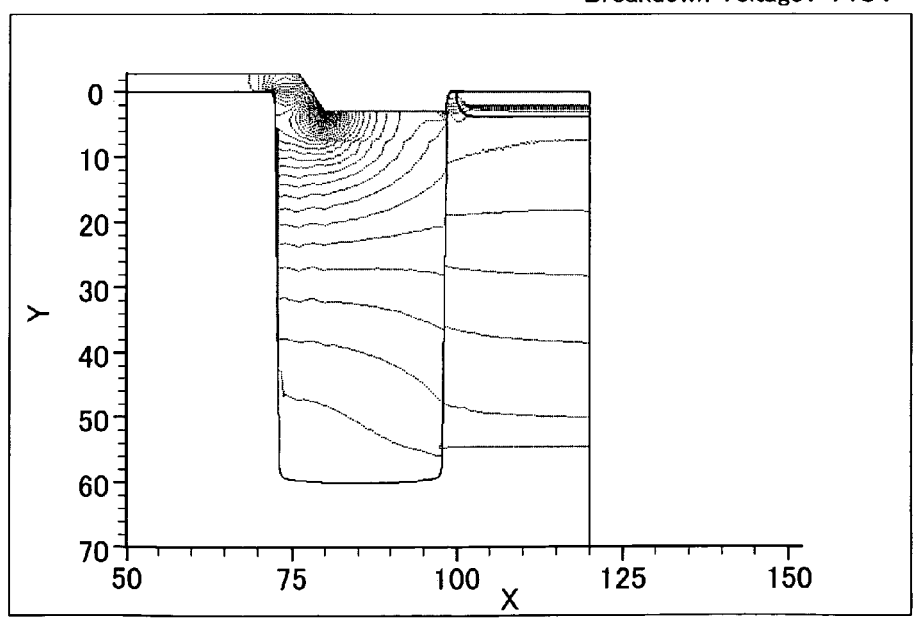
FIG. 18 shows a simulated electric field distribution when a reverse bias is applied to a transistor formed in a device active region in the semiconductor chip of the second embodiment of the present invention.

FIG. 18 shows a simulated electric field distribution when a reverse bias is applied in the semiconductor chip of the second embodiment. Under the same simulation condition as in the above example, the breakdown voltage is estimated to reach 718 V. The field plate 6a may be altered to extend beyond the notch 9, for example, to the outer sidewall of the trench 4 or farther in FIG. 17.

Figure 19:
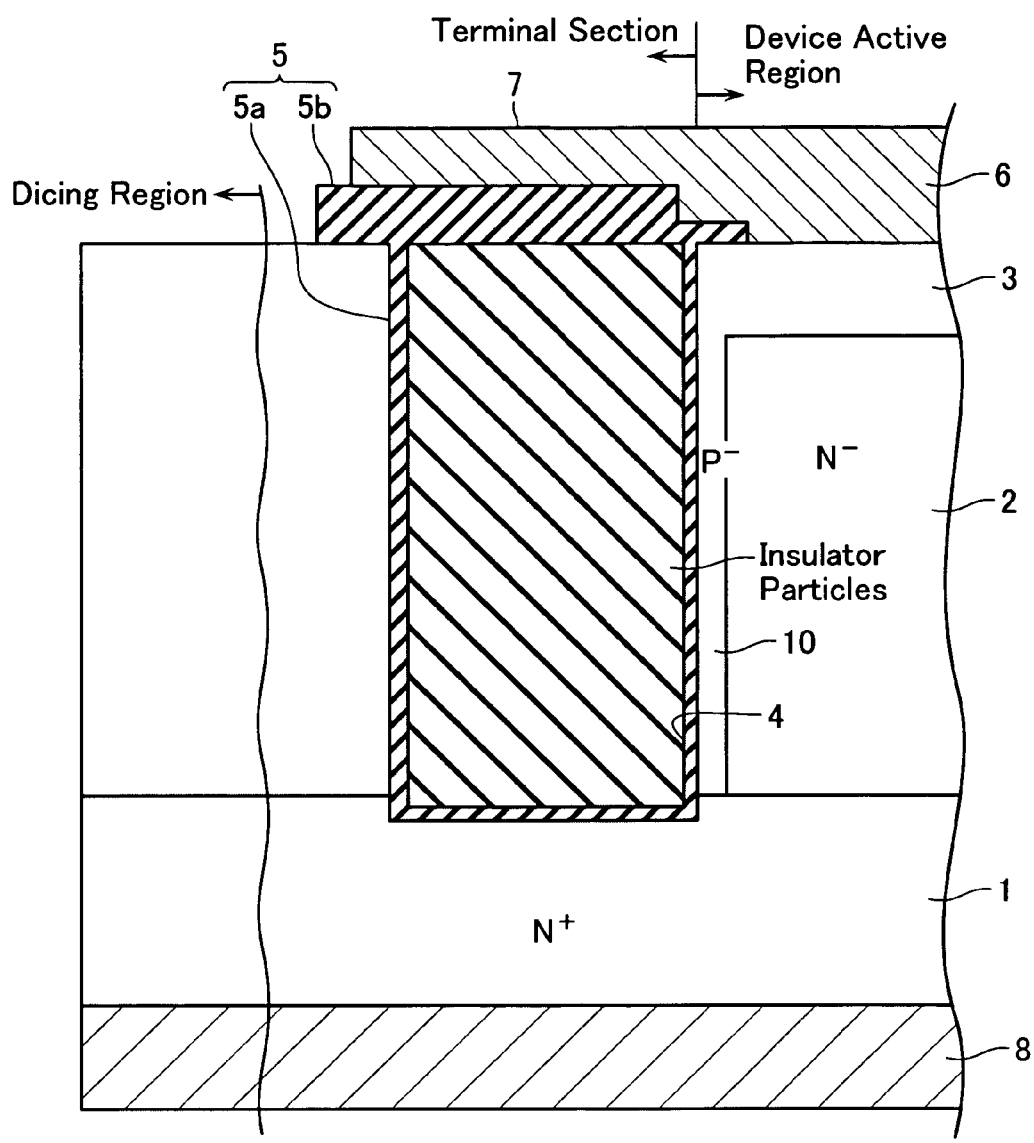
FIG. 19 shows a cross-sectional view of the major part of a semiconductor chip of a third embodiment of the present invention.
Figure 20:
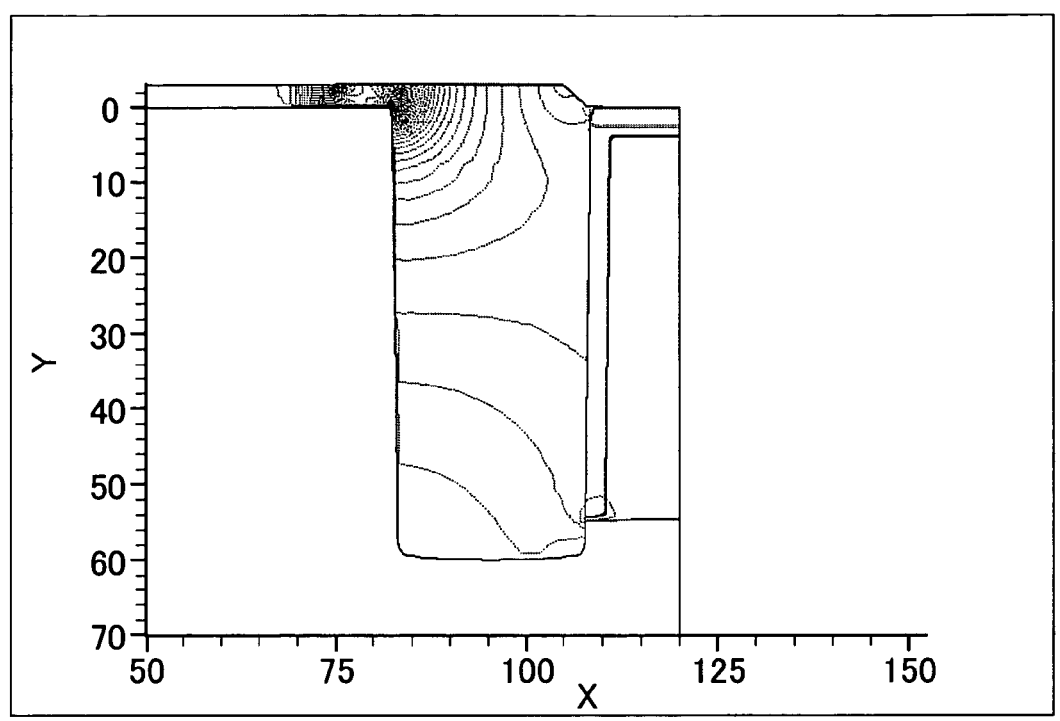
FIG. 20 shows a simulated electric field distribution when a reverse bias is applied to a transistor formed in a device active region in the semiconductor chip of the third embodiment of the present invention.

FIG. 19 shows a cross-sectional view of the major part of a semiconductor chip of a third embodiment of the present invention. This embodiment is same in features of the trench 4 and the field plate 6a as the first embodiment. There is a difference in a P$^-$-type layer 10 (side semiconductor layer), which is formed in contact with the N$^-$-type epitaxial layer 2 in a portion adjacent to the wall of the trench 4 in the device active region. FIG. 20 shows a simulated electric field distribution when a reverse bias is applied in the semiconductor chip of the third embodiment. In an example of the P$^-$-type layer 10 having an impurity concentration of $4.0 \times 10^{15}$ cm$^{-3}$, under the same simulation condition as in the above example, the breakdown voltage is estimated to reach 910 V.

Figure 21:
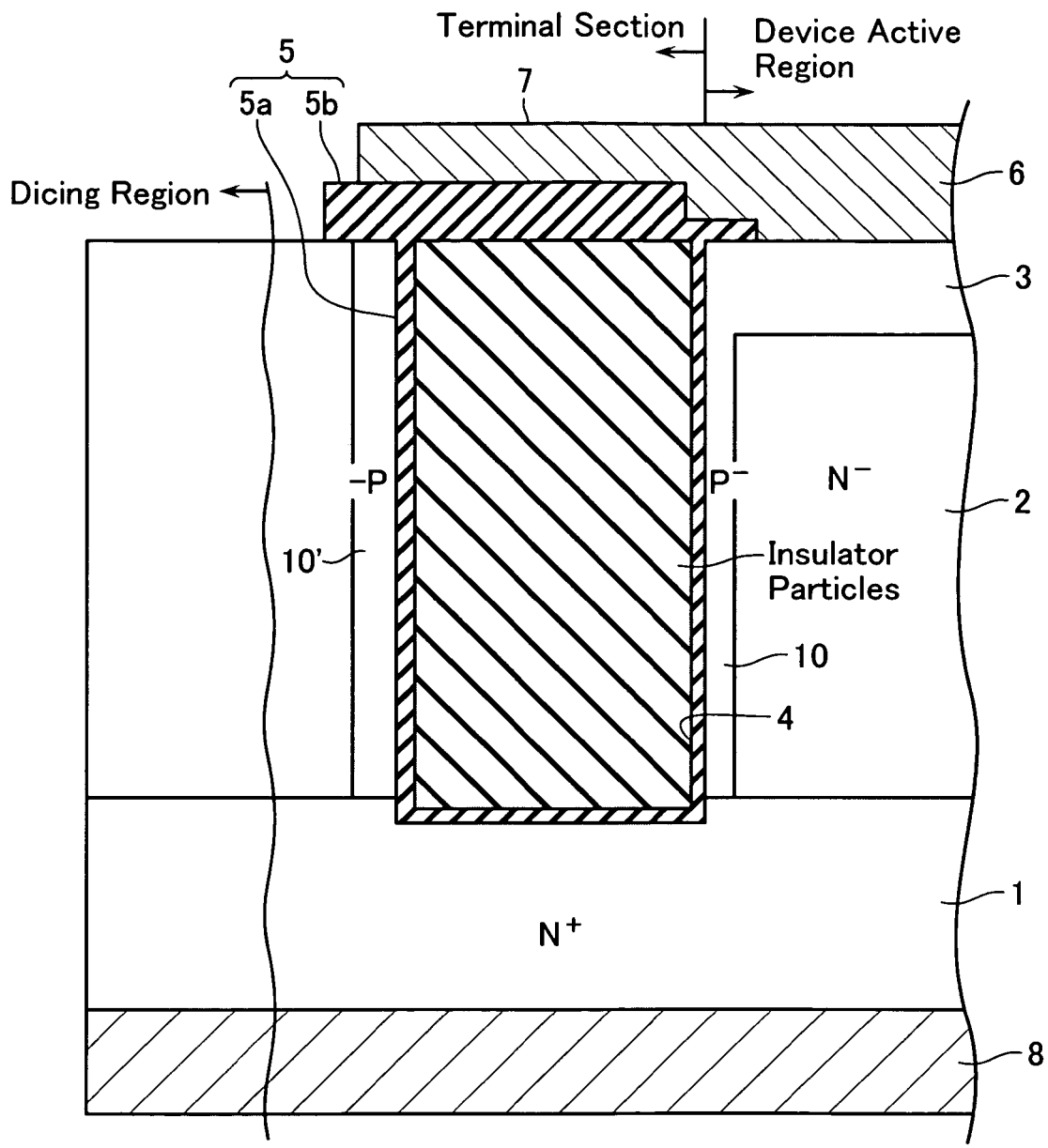
FIG. 21 shows a cross-sectional view of the major part of a semiconductor chip of a fourth embodiment of the present invention.
Figure 22:
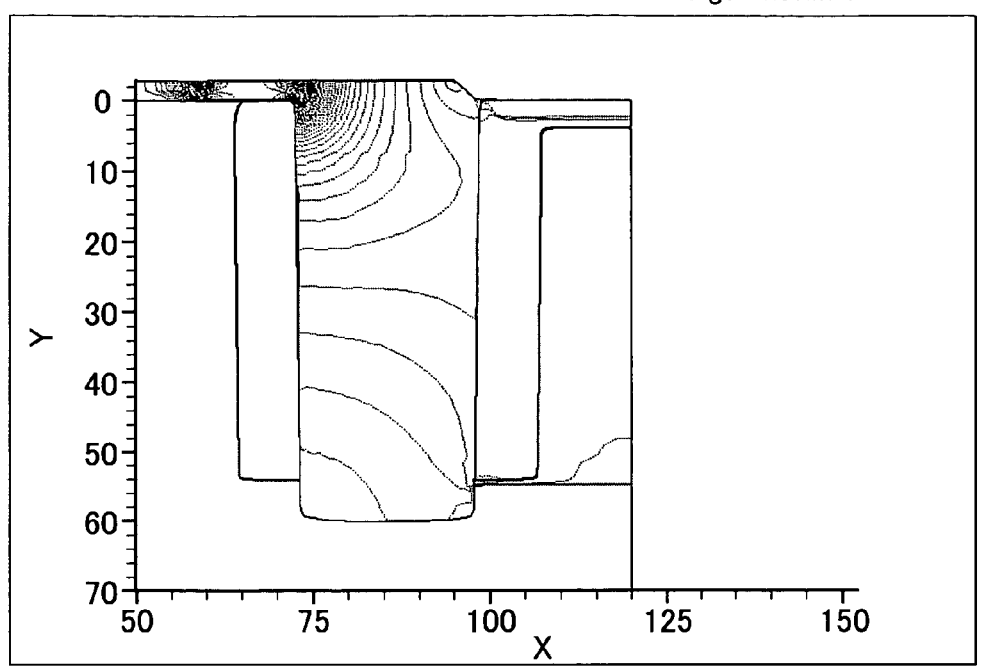
FIG. 22 shows a simulated electric field distribution when a reverse bias is applied to a transistor formed in a device active region in the semiconductor chip of the fourth embodiment of the present invention.

FIG. 21 shows a cross-sectional view of the major part of a semiconductor chip of a fourth embodiment of the present invention. In this embodiment, P$^-$-type layers 10 and 10' are formed at both sides (the device active region side and the terminal section side) of the trench 4 in the device active region. FIG. 22 shows a simulated electric field distribution when a reverse bias is applied in the semiconductor chip of the fourth embodiment. Under the same simulation condition as in the above example, the breakdown voltage is estimated to reach 910 V.

Figure 23:
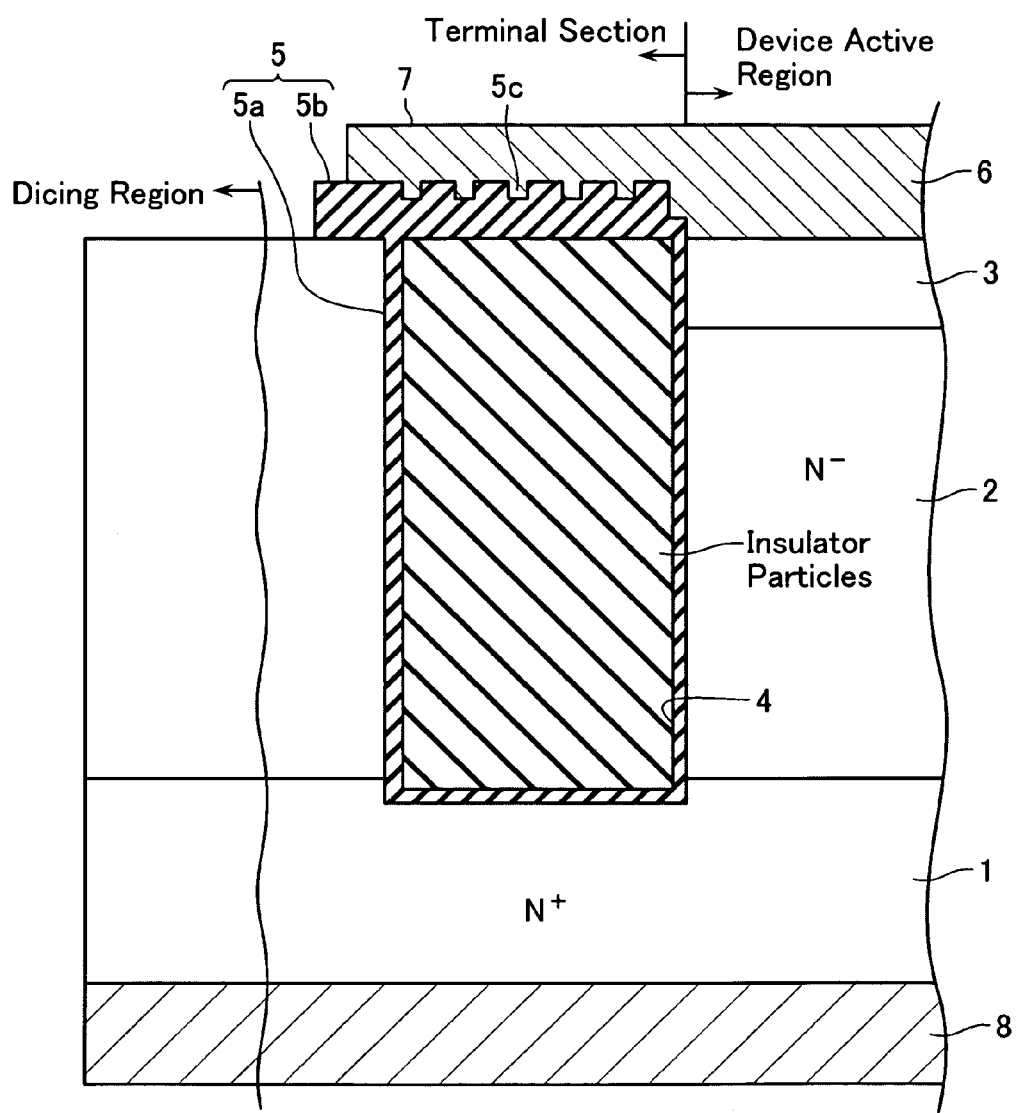
FIG. 23 shows a cross-sectional view of the major part of a semiconductor chip of a fifth embodiment of the present invention.

FIG. 23 shows a cross-sectional view of the major part of a semiconductor chip of a fifth embodiment of the present invention. In this embodiment, a rough surface 5c is formed in the upper surface of the oxide film 5b formed above the trench 4. The electrode metal film 6 is formed to fill in the rough surface 5c. This embodiment is approximate to the second embodiment shown in FIG. 17 in groove formation in the oxide film 5b. Though it is different from the second embodiment in the rough surface 5c formed to include not a single groove but a plurality of grooves aligned from the device active region toward the terminal section.

Figure 24:
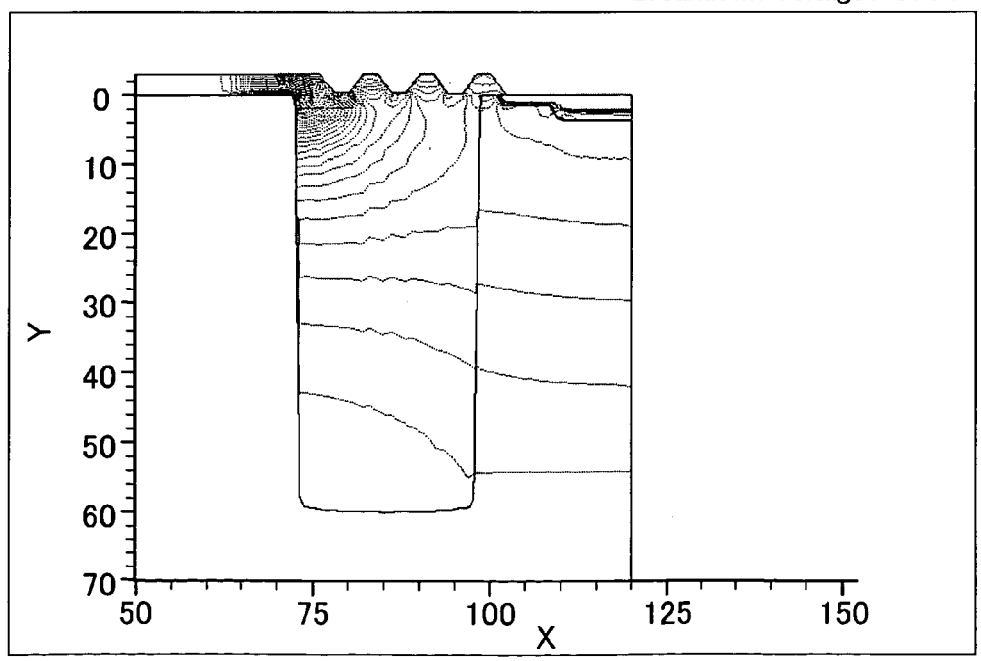
FIG. 24 shows a simulated electric field distribution when a reverse bias is applied to a transistor formed in a device active region in the semiconductor chip of the fifth embodiment of the present invention.

FIG. 24 shows a simulated electric field distribution when a reverse bias is applied in the semiconductor chip of the fifth embodiment. Under the same simulation condition as in the above example, the breakdown voltage is estimated to reach 679 V.

In the embodiments of the present invention described above, as the field plate extends to above the trench, the electric field extends to the field plate and the underlying filler. Accordingly, the concentration of the electric field can be relieved at the junction along the device active region and consequently the breakdown voltage of the semiconductor element can be prevented from lowering. The embodiments of the invention have been described above while the present invention is not limited to these embodiments. Rather, various modifications, additions and replacements can be devised without departing from the spirit and scope of the invention.

What is claimed is:

1. A semiconductor device, comprising:
    a device active region defined for forming a semiconductor element in a semiconductor layer formed on a semiconductor substrate;
    a terminal section formed in the periphery of said semiconductor layer on the semiconductor substrate to surround said device active region, said terminal section including a trench formed in said semiconductor layer, having first and second opposing sides, said first side located adjacent to said device active region, and a filler filled in said trench, and said terminal section being adjacent to a dicing region; and
    a field plate extended to above said trench from an electrode of said semiconductor element formed in said device active region, wherein a tip of said field plate reaches said second side of said trench and does not come into contact with a region outside of said active region.

2. The semiconductor device according to claim 1, further comprising an upper insulator formed between said filler and said field plate.

3. The semiconductor device according to claim 1, wherein said trench is formed in a depth reaching said semiconductor substrate.

4. The semiconductor device according to claim 1, wherein said filler comprises an insulator.

5. The semiconductor device according to claim 1, wherein said filler comprises a silicon oxide.

6. The semiconductor device according to claim 1, wherein said filler is composed of silica particles filled in said trench, said silica particles having a particle diameter sufficiently smaller than a trench width.

7. The semiconductor device according to claim 1, wherein said trench is provided with an insulator film formed on a sidewall thereof said filler being filled in said trench on said insulator film.

8. The semiconductor device according to claim 1, further comprising an upper insulator formed on said filler, wherein said field plate is formed to partly enter a recess formed in said upper insulator.

9. The semiconductor device according to claim 8, wherein said recess is formed as one of recesses aligned from said device active region toward said terminal section.

10. The semiconductor device according to claim 1, further comprising a side semiconductor layer formed along a sidewall of said trench, said side semiconductor layer being different in conduction type from said semiconductor layer.

11. The semiconductor device according to claim 10, wherein said side semiconductor layer is formed on said sidewall of said trench only in said device active region.

12. The semiconductor device according to claim 10, wherein said side semiconductor layer is formed on said sidewall of said trench in both said device active region and said terminal section.

13. The semiconductor device of claim 1, wherein said trench is formed at a boundary between said device active region and said terminal section with no guard ring layers.

14. The semiconductor device of claim 1, wherein said semiconductor element is a MOSFET.

15. The semiconductor device of claim 1, wherein said semiconductor element is an IGBT.

16. The semiconductor device according to claim 1, further comprising an electrode formed on a rear surface of said semiconductor substrate.

17. The semiconductor device according to claim 1, wherein said terminal section has no active devices formed therein.

* * * * *